(12) United States Patent
Liu et al.

(10) Patent No.: US 11,747,089 B2
(45) Date of Patent: Sep. 5, 2023

(54) THREE-DIMENSIONAL HEAT EXCHANGER

(71) Applicant: VAST GLORY ELECTRONICS & HARDWARE & PLASTIC(HUI ZHOU) LTD., Hui Zhou (CN)

(72) Inventors: Lei Lei Liu, Hui Zhou (CN); Xue Mei Wang, Hui Zhou (CN)

(73) Assignee: VAST GLORY ELECTRONICS & HARDWARE & PLASTIC(HUI ZHOU) LTD., Hui Zhou (CN)

( * ) Notice: Subject to any disclaimer, the term of this patent is extended or adjusted under 35 U.S.C. 154(b) by 0 days.

(21) Appl. No.: 17/233,463

(22) Filed: Apr. 17, 2021

(65) Prior Publication Data
US 2022/0163267 A1 May 26, 2022

(30) Foreign Application Priority Data
Nov. 24, 2020 (CN) .......................... 202011327804.4

(51) Int. Cl.
*F28D 15/02* (2006.01)
*F28D 15/04* (2006.01)
*F28F 3/06* (2006.01)

(52) U.S. Cl.
CPC ..... *F28D 15/0233* (2013.01); *F28D 15/0275* (2013.01); *F28D 15/046* (2013.01); *F28F 3/06* (2013.01)

(58) Field of Classification Search
CPC .... F28D 15/0233; F28D 15/046; F28D 15/02; F28D 15/04; F28D 15/0275; F28D 2240/00; F28F 2215/06; F28F 3/06
See application file for complete search history.

(56) References Cited

U.S. PATENT DOCUMENTS

| 2009/0025910 | A1* | 1/2009 | Hoffman | F28D 15/046 165/104.21 |
| 2017/0082378 | A1* | 3/2017 | Wang | H01L 23/427 |
| 2019/0343021 | A1* | 11/2019 | Zhang | F28D 15/0275 |
| 2020/0355444 | A1* | 11/2020 | Chen | F28D 15/0283 |

* cited by examiner

*Primary Examiner* — Tavia Sullens
*Assistant Examiner* — Khaled Ahmed Ali Al Samiri
(74) *Attorney, Agent, or Firm* — Maschoff Brennan

(57) ABSTRACT

A three-dimensional heat exchanger including first thermally conductive plate, second thermally conductive plate, a plurality of supporting structures, at least one thermally conductive structure, at least one capillary structure and at least one heat pipe. Second thermally conductive plate has at least one through hole. Second thermally conductive plate is attached to first thermally conductive plate so that liquid-tight chamber is formed between first and second thermally conductive plate. An end of each of supporting structures is connected to first thermally conductive plate. Another end of each of supporting structures is connected to second thermally conductive plate. Thermally conductive structure is connected to at least a part of supporting structures. Capillary structure is stacked on first thermally conductive plate, at least a part of supporting structures, and thermally conductive structure. Heat pipe is disposed through the through hole.

15 Claims, 3 Drawing Sheets

THREE-DIMENSIONAL HEAT EXCHANGER

CROSS-REFERENCE TO RELATED APPLICATIONS

This non-provisional application claims priority under 35 U.S.C. § 119(a) on Patent Application No(s). 202011327804.4 filed in China, on Nov. 24, 2020, the entire contents of which are hereby incorporated by reference.

TECHNICAL FIELD

The disclosure relates to a heat exchanger, more particularly to a three-dimensional heat exchanger.

BACKGROUND

In general, a heat pipe only transfers heat in one dimension (i.e., the axis of the heat pipe), and a vapor chamber can be regard as a planar heat pipe that can transfer heat in two dimensions and thus can transfer heat in a more efficient manner. The vapor chamber mainly includes a plate body and a capillary structure. The plate body has a chamber filled with a working fluid. The capillary structure is accommodated in the chamber of the plate body. A part of the plate body that is heated defines an evaporation space of the chamber, and the remaining part of the plate body defines a condensation space of the chamber. The working fluid in the evaporation space is evaporated into vapor, and then flows to the condensation space due to the pressure difference. The working fluid flowing to the condensation space is condensed into liquid and then flows back to the evaporation space with the help of the capillary structure, thereby completing a cycle.

However, in current heat dissipation system or assembly including both of the heat pipe and the vapor chamber, the heat pipe and the vapor chamber are independent from each other, such that the heat transfer efficiency of the heat dissipation system or assembly is hard to be further improved.

SUMMARY

The disclosure provides a three-dimensional heat exchanger including at least one heat pipe and a vapor chamber that cooperate with each other to allow the heat transfer efficiency of the three-dimensional heat exchanger to be high.

One embodiment of this disclosure provides a three-dimensional heat exchanger including a first thermally conductive plate, a second thermally conductive plate, a plurality of supporting structures, at least one thermally conductive structure, at least one capillary structure and at least one heat pipe. The second thermally conductive plate has at least one through hole. The second thermally conductive plate is attached to the first thermally conductive plate so that a liquid-tight chamber is formed between the first thermally conductive plate and the second thermally conductive plate. An end of each of the plurality of supporting structures is connected to the first thermally conductive plate. Another end of each of the plurality of supporting structures is connected to the second thermally conductive plate. The at least one thermally conductive structure is connected to at least a part of the plurality of supporting structures. The at least one capillary structure is stacked on the first thermally conductive plate, at least a part of the plurality of supporting structures, and the at least one thermally conductive structure. The at least one heat pipe is disposed through the at least one through hole.

According to the three-dimensional heat exchanger disclosed by the above embodiments, the vapor chamber and the heat pipe cooperate with each other. Thus, the two-dimensional heat transfers of the vapor chamber and the one-dimensional heat transfer of the heat pipe are combined to provide three-dimensional heat transfer, thereby allowing the three-dimensional heat exchanger to have a high heat transfer efficiency.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
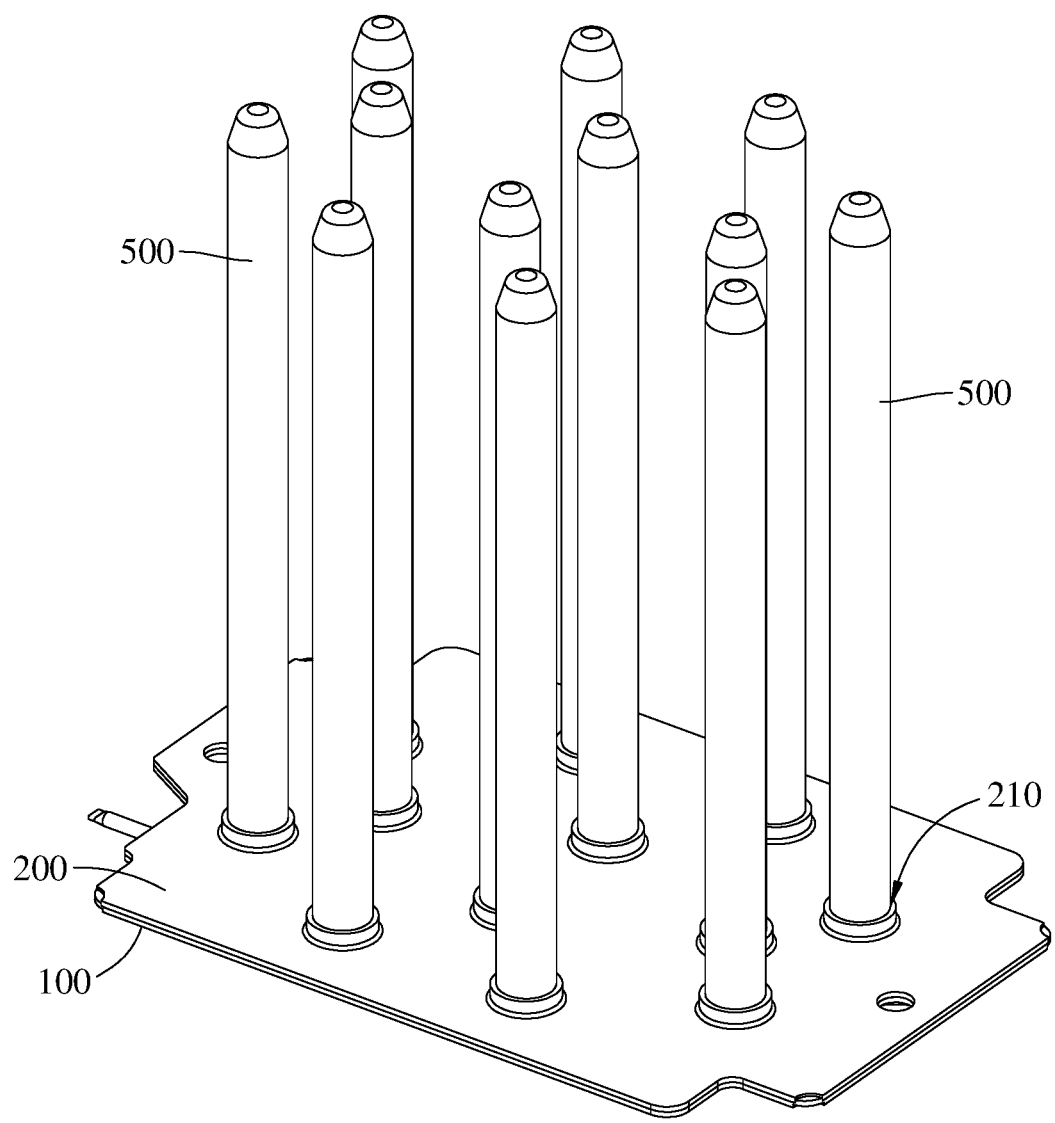
FIG. 1 is a perspective view of a three-dimensional heat exchanger according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
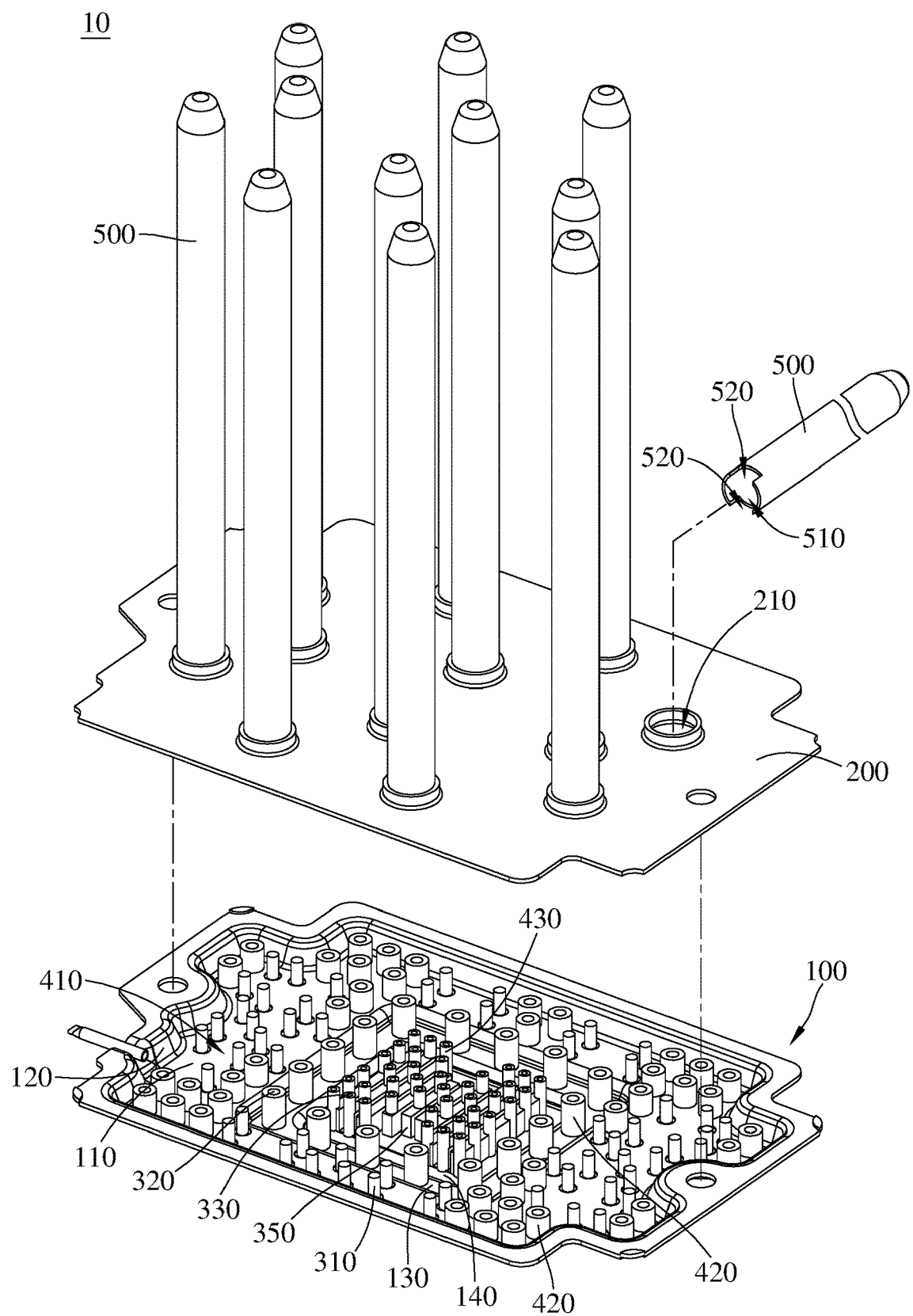
FIG. 2 is an exploded view of the three-dimensional heat exchanger according to FIG. 1.
Figure 3:
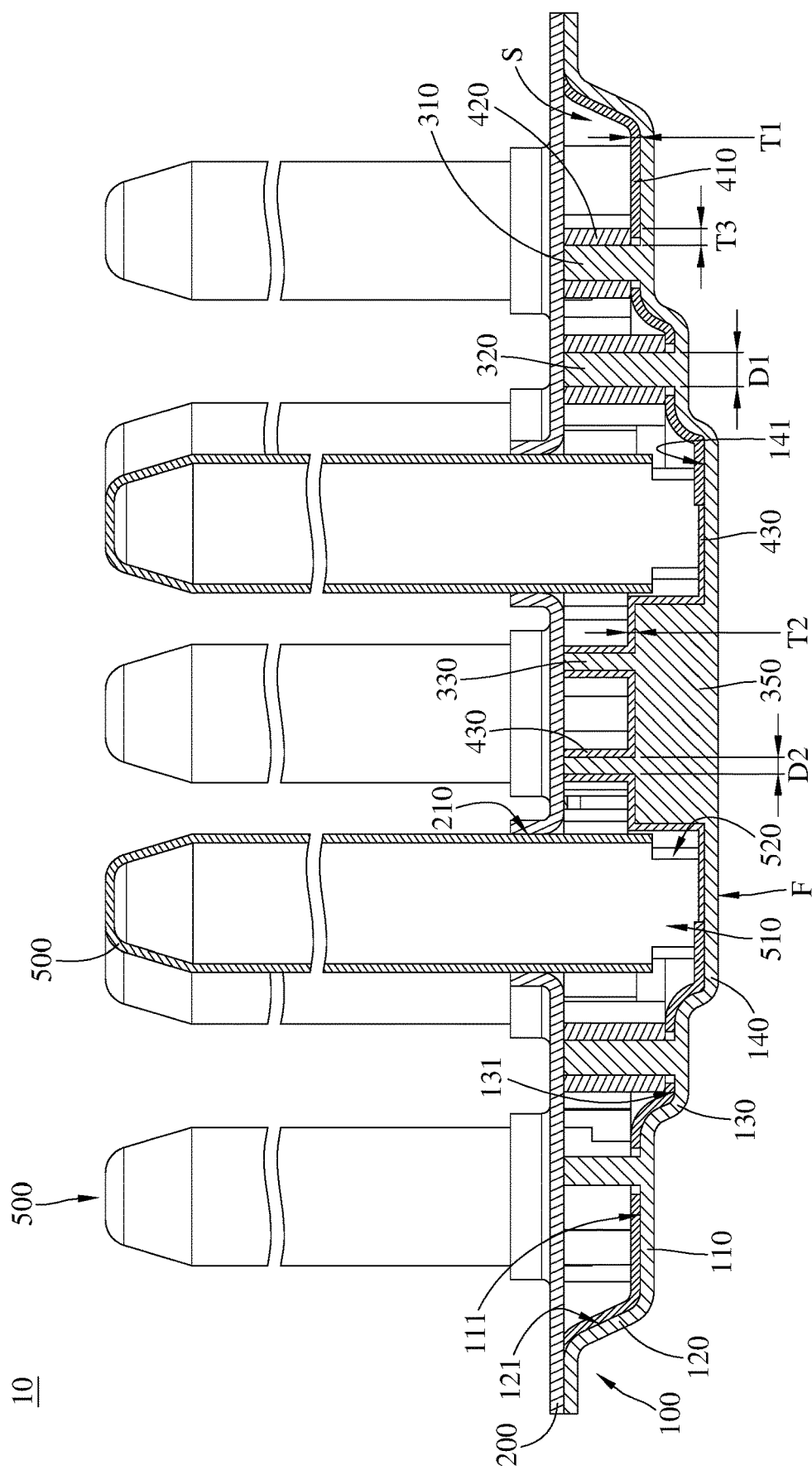
FIG. 3 is a cross-sectional view of the three-dimensional heat exchanger according to FIG. 1.

Please refer to FIGS. 1 to 3. FIG. 1 is a perspective view of a three-dimensional heat exchanger 10 according to one embodiment of the disclosure. FIG. 2 is an exploded view of the three-dimensional heat exchanger 10 according to FIG. 1. FIG. 3 is a cross-sectional view of the three-dimensional heat exchanger 10 according to FIG. 1.

In this embodiment, the three-dimensional heat exchanger 10 includes a first thermally conductive plate 100, a second thermally conductive plate 200, a plurality of supporting structures 310, 320 and 330, a plurality of thermally conductive structures 350, a plurality of capillary structures 410, 420 and 430 and a plurality of heat pipes 500. It is noted that the first thermally conductive plate 100, the second thermally conductive plate 200, the supporting structures 310, 320 and 330, the thermally conductive structures 350, and the capillary structures 410, 420 and 430 can be together regarded as a vapor chamber.

The first thermally conductive plate 100 and the second thermally conductive plate 200 are made of, for example, metal. The first thermally conductive plate 100 and the second thermally conductive plate 200 are made by, for example, stamping process. The second thermally conductive plate 200 is attached to the first thermally conductive plate 100 so that a liquid-tight chamber S is formed between the first thermally conductive plate 100 and the second thermally conductive plate 200.

The first thermally conductive plate 100 includes a base part 110, a side part 120, a first protruding part 130 and a second protruding part 140. The side part 120 is connected to a periphery of the base part 110. The first protruding part 130 protrudes from the base part 110 along a direction away from the second thermally conductive plate 200. The second protruding part 140 protrudes from the first protruding part 130 along the direction away from the second thermally conductive plate 200. The second protruding part 140 has a thermal contact surface F located on a side of the second protruding part 140 that is located away from the second thermally conductive plate 200; that is, the thermal contact surface F faces away from the second thermally conductive plate 200. The thermal contact surface F is configured to be in thermal contact with a heat source (not shown). The heat source is, for example, a central processing unit (CPU) or a graphics processing unit (GPU). The second thermally conductive plate 200 has a plurality of through holes 210.

An end of each of the supporting structures 310, 320 and 330 is connected to the first thermally conductive plate 100, and the other end of each of the supporting structures 310, 320 and 330 is connected to the second thermally conductive plate 200. In detail, the supporting structure 310, 320 and 330 include a plurality of first supporting structures 310, a plurality of second supporting structures 320 and a plurality of third supporting structures 330. The first supporting structures 310 protrude from an inner surface 111 of the base part 110 of the first thermally conductive plate 100. The second supporting structures 320 protrude from an inner surface 131 of the first protruding part 130 of the first thermally conductive plate 100. The third supporting structures 330 protrude from an inner surface 141 of the second protruding part 140 of the first thermally conductive plate 100. The first supporting structures 310 and the second supporting structures 320 each have a diameter D1 that is greater than a diameter D2 of the third supporting structures 330.

The thermally conductive structures 350 protrude from the inner surface 141 of the second protruding part 140 of the first thermally conductive plate 100, and the thermally conductive structures 350 are parallel to one another. Further, the thermally conductive structures 350 are in thermal contact with the first thermally conductive plate 100. Moreover, the thermally conductive structures 350 are, for example, connected to at least a part of the third supporting structures 330.

In this embodiment, for example, the thermally conductive structures 350 are rectangular prisms or bars that are different in length, but the disclosure is not limited thereto. In other embodiments, as long as the thermally conductive structures can cause desired vapor pressure drop and reduce the high liquid pressure drop caused by the capillary structures in the liquid-tight chamber S, the thermally conductive structures may not be rectangular prisms.

In this embodiment, for example, each of the supporting structures 310, 320 and 330 and the thermally conductive structures 350 is integrally formed with the first thermally conductive plate 100 as a single-piece by stamping, milling and the like, but the disclosure is not limited thereto. In other embodiments, the supporting structures and the thermally conductive structures may be connected to the first thermally conductive plate by any suitable bonding technique such as welding, diffusion bonding, thermal pressing, soldering, brazing and adhering.

In this embodiment, the thermally conductive structures 350 are parallel to one another, but the disclosure is not limited thereto. In other embodiments, the thermally conductive structures may be arranged radially.

In this embodiment, the thermally conductive structures 350 merely connected to at least a part of the third supporting structures, but the disclosure is not limited thereto. In other embodiments, the thermally conductive structures may be connected to at least a part of the first supporting structures 310 and at least a part of the second supporting structures 320.

In this embodiment, the thermally conductive structures 350 are spaced apart from the second thermally conductive plate 200, but the disclosure is not limited thereto. In other embodiments, the thermally conductive structures 350 may be in thermal contact with the second thermally conductive plate 200.

In this embodiment, there are a plurality of thermally conductive structures 350, but the disclosure is not limited thereto. In other embodiments, there may only be a single thermally conductive structure.

The capillary structures 410, 420 and 430 are selected from a group consisting of a metal mesh, a sintered powder structure and a sintered ceramic structure. In this embodiment, the capillary structures 410, 420 and 430 include a first capillary structure 410, a plurality of second capillary structures 420 and a third capillary structure 430. The first capillary structure 410 is stacked on at least a part of the inner surface 111 of the base part 110 of the first thermally conductive plate 100, at least a part of the inner surface 121 of the side part 120 and at least a part of the inner surface 131 of the first protruding part 130. The second capillary structures 420 respectively cover at least a part of the first supporting structures 310 and at least a part of the second supporting structures 320. The third capillary structure 430 covers at least a part of the third supporting structures 330. A thickness T1 of the first capillary structure 410 is greater than a thickness T2 of the third capillary structure 430. The thickness T2 of the third capillary structure 430 is smaller than a thickness T3 of the second capillary structures 420. During the evaporation process of a working fluid, the thermal resistance of the capillary structure is decrease with the thickness of the capillary structure. Thus, as long as the third capillary structure 430 is functional, the thickness T2 of the third capillary structure 430 can be designed to be small to reduce the thermal resistance of the third capillary structure 430. In practical, when the thickness T2 of the third capillary structure 430 is increased from 0.4 millimeters (mm) to 0.6 mm, the thermal resistance of the third capillary structure 430 is increased from 0.0222° C./W to 0.0333° C./W.

In this embodiment, the relationship among the thickness of the first capillary structure 410, the thickness of the second capillary structures 420 and the thickness of the third capillary structure 430 is not intended to limited the disclosure. In other embodiments, the thickness of the first capillary structure may be smaller than the thickness of the third capillary structure, and the thickness of the third capillary structure may be greater than the thickness of the second capillary structures.

In this embodiment, the third capillary structure 430 is further stacked on at least a part of the inner surface 141 of the second protruding part 140 and covers the thermally conductive structures 350.

In this embodiment, there are a plurality of capillary structures 410, 420 and 430, but the disclosure is not limited thereto. In other embodiments, there may only be a single capillary structure.

The heat pipes 500 are respectively disposed through the through holes 210, and the heat pipes 500 respectively rest on the inner surface 111 of the base part 110 of the first thermally conductive plate 100, the inner surface 131 of the first protruding part 130 and the inner surface 141 of the second protruding part 140. Each heat pipe 500 has an opening 510 and two notches 520a on an end thereof. The opening 510 is in fluid communication with the liquid-tight chamber S via the two notches 520. The working fluid is, for example, water in vapor form. The working fluid is configured to flow through the notches 520.

In this embodiment, since the heat pipes 500 rest on the first thermally conductive plate 100, the heat pipes 500 need to have the notches 520 so that an inner chamber of each heat pipe 500 can be in fluid communication with the liquid-tight chamber S via the notches 520 of each heat pipe 500, but the disclosure is not limited thereto. In other embodiments where the heat pipes do not rest on the first thermally conductive plate 100, the heat pipes may not have the notches, and each heat pipe can be in fluid communication with the liquid-tight chamber S directly via the opening of each heat pipe.

In this embodiment, the capillary structures (not shown) of the heat pipes 500 are respectively connected to the capillary structures 410, 420 and 430, for example, via a manner involving metallic bonding. For example, the capillary structures (not shown) of the heat pipes 500 are connected to the capillary structures 410, 420 and 430 via the sintering process. In this way, the speed of transferring fluid between capillary structures is enhanced, thereby enhancing the heat transfer efficiency of the three-dimensional heat exchanger 10. Note that the connection manner between the capillary structures of the heat pipes 500 and the capillary structures 410, 420 and 430 are not intended to limit the disclosure. In other embodiments, the capillary structures of the heat pipes 500 may merely rest on the capillary structures 410, 420 and 430 of the three-dimensional heat exchanger.

In this embodiment, there are a plurality of heat pipes 500, but the disclosure is not limited thereto. In other embodiments, there may only be a single heat pipe.

According to the three-dimensional heat exchanger disclosed by the above embodiments, the vapor chamber and the heat pipe cooperate with each other. Thus, the two-dimensional heat transfers of the vapor chamber and the one-dimensional heat transfer of the heat pipe are combined to provide three-dimensional heat transfer, thereby allowing the three-dimensional heat exchanger to have a high heat transfer efficiency.

Further, in some embodiments, comparing to a case that the capillary structure in the heat pipe merely rests on the capillary structure of the three-dimensional heat exchanger, connecting these two capillary structures via a manner involving the metallic bonding enhances the speed of transferring fluid between these two capillary structures, thereby enhancing the heat transfer efficiency of the three-dimensional heat exchanger.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A three-dimensional heat exchanger, comprising:
a first thermally conductive plate;
a second thermally conductive plate, having a plurality of through holes, wherein the second thermally conductive plate is attached to the first thermally conductive plate so that a liquid-tight chamber is formed between the first thermally conductive plate and the second thermally conductive plate;
a plurality of supporting structures, wherein an end of each of the plurality of supporting structures is connected to the first thermally conductive plate, another end of each of the plurality of supporting structures is connected to the second thermally conductive plate;
at least one thermally conductive structure, connected to at least a part of the plurality of supporting structures;
at least one capillary structure, stacked on the first thermally conductive plate, at least a part of the plurality of supporting structures, and the at least one thermally conductive structure; and
a plurality of heat pipes, disposed respectively through the plurality of through holes, wherein the at least one thermally conductive structure separates from the plurality of heat pipes;
wherein the first thermally conductive plate comprises a base part, a side part, a first protruding part and a second protruding part, the side part is connected to a peripheral of the base part, the first protruding part protrudes from the base part along a direction away from the second thermally conductive plate, the second protruding part protrudes from the first protruding part along the direction away from the second thermally conductive plate, wherein the plurality of heat pipes respectively rest on the first protruding part and the second protruding part, and each heat pipe of the plurality of heat pipes that rest on the first protruding part comprises a first notch and each heat pipe of the plurality of heat pipes that rest on the second protruding part comprises a second notch, and a height of the at least one thermally conductive structure is lower than a height of the first notch and higher than a height of the second notch.

2. The three-dimensional heat exchanger according to claim 1, wherein the at least one capillary structure is selected from a group consisting of a metal mesh, a sintered powder structure and a sintered ceramic structure.

3. The three-dimensional heat exchanger according to claim 1, wherein each of the plurality of heat pipes has an opening located on an end thereof, and the opening is in fluid communication with the liquid-tight chamber.

4. The three-dimensional heat exchanger according to claim 3, wherein the first notches and the second notches are in fluid communication with the openings respectively.

5. The three-dimensional heat exchanger according to claim 1, wherein a plurality of capillary structures of the plurality of heat pipes are connected to the at least one capillary structure of the three-dimensional heat exchanger.

6. The three-dimensional heat exchanger according to claim 1, wherein a capillary structure of the plurality of heat pipes is connected to the at least one capillary structure of the three-dimensional heat exchanger via a manner involving metallic bonding.

7. The three-dimensional heat exchanger according to claim 1, wherein the plurality of supporting structures protrude from the base part, the first protruding part and the second protruding part; the at least one thermally conductive structure protrudes from the second protruding part; and the at least one capillary structure of the three-dimensional heat exchanger is stacked on an inner surface of the base part, an inner surface of the side part, an inner surface of the first protruding part, an inner surface of the second protruding part and the plurality of supporting structures.

8. The three-dimensional heat exchanger according to claim 7, wherein the plurality of supporting structures comprise a plurality of first supporting structures, a plurality of second supporting structures and a plurality of third supporting structures; the plurality of first supporting structures protrude from the inner surface of the base part; the plurality of second supporting structures protrude from the inner surface of the first protruding part; the plurality of third supporting structures protrude from the inner surface of the second protruding part; and the first supporting structures and the second supporting structures each have a diameter that is greater than a diameter of each of the third supporting structures, and the at least one thermally conductive structure is connected to at least a part of the plurality of third supporting structures.

9. The three-dimensional heat exchanger according to claim 8, wherein the at least one capillary structure of the three-dimensional heat exchanger comprises a first capillary structure, a plurality of second capillary structures and a third capillary structure; the first capillary structure is stacked on at least a part of the inner surface of the base part, at least a part of the inner surface of the side part, and at least a part of the inner surface of the first protruding part; the plurality of second capillary structures respectively cove r at least a part of the plurality of first supporting structures and at least a part of the plurality of second supporting structures; the third capillary structure covers at least a part of the plurality of third supporting structures; and a thickness of the first capillary structure is greater than a thickness of the third capillary structure, and the thickness of the third capillary structure is smaller than a thickness of each of the plurality of second capillary structures.

10. The three-dimensional heat exchanger according to claim 9, wherein the third capillary structure is stacked on at least a part of the inner surface of the second protruding part.

11. The three-dimensional heat exchanger according to claim 10, wherein the third capillary structure covers the at least one thermally conductive structure.

12. The three-dimensional heat exchanger according to claim 11, wherein the plurality of second capillary structures and the third capillary structure are in thermal contact with the second thermally conductive plate.

13. The three-dimensional heat exchanger according to claim 1, wherein the at least one thermally conductive structure comprises a plurality of thermally conductive structures that are parallel to one another.

14. The three-dimensional heat exchanger according to claim 1, wherein the at least one thermally conductive structure is in thermal contact with the first thermally conductive plate.

15. The three-dimensional heat exchanger according to claim 1, wherein the at least one thermally conductive structure is spaced apart from the second thermally conductive plate.

* * * * *